United States Patent
Zhou et al.

(10) Patent No.: US 10,768,373 B2
(45) Date of Patent: Sep. 8, 2020

(54) OPTICAL FIBER STRUCTURES AND METHODS FOR VARYING LASER BEAM PROFILE

(71) Applicants: Wang-Long Zhou, Andover, MA (US); Francisco Villarreal-Saucedo, Middleton, MA (US); Parviz Tayebati, Sherborn, MA (US); Bien Chann, Merrimack, NH (US)

(72) Inventors: Wang-Long Zhou, Andover, MA (US); Francisco Villarreal-Saucedo, Middleton, MA (US); Parviz Tayebati, Sherborn, MA (US); Bien Chann, Merrimack, NH (US)

(73) Assignee: TERADIODE, INC., Wilmington, MA (US)

( * ) Notice: Subject to any disclaimer, the term of this patent is extended or adjusted under 35 U.S.C. 154(b) by 0 days.

(21) Appl. No.: 16/201,333

(22) Filed: Nov. 27, 2018

(65) Prior Publication Data
US 2019/0113688 A1    Apr. 18, 2019

Related U.S. Application Data

(63) Continuation of application No. 16/117,253, filed on Aug. 30, 2018, which is a continuation of application
(Continued)

(51) Int. Cl.
*G02B 6/26* (2006.01)
*G02B 6/32* (2006.01)
(Continued)

(52) U.S. Cl.
CPC ........... *G02B 6/32* (2013.01); *G02B 6/02042* (2013.01); *G02B 6/03644* (2013.01); *G02B 6/34* (2013.01);
(Continued)

(58) Field of Classification Search
CPC . G02B 6/32; G02B 17/00; G02B 6/34; G02B 6/03644; G02B 6/02042; G02B 2006/12121; G02B 2006/12104; G02B 6/4214; H01S 5/005; H01S 2301/20; H01S 5/4087; H01S 5/4062; H01S 5/405; H01S 5/4031; H01S 5/143; H01S 5/0071
See application file for complete search history.

(56) References Cited

U.S. PATENT DOCUMENTS 5,742,722 A    4/1998  Imoto
6,266,467 B1   7/2001  Kato et al.
(Continued)

FOREIGN PATENT DOCUMENTS

JP    2016029454    3/2016

OTHER PUBLICATIONS

International Search Report and Written Opinion, International Application No. PCT/US2017/026103, dated May 29, 2017, 14 pages.

*Primary Examiner* — Ellen E Kim
(74) *Attorney, Agent, or Firm* — Morgan, Lewis & Bockius LLP (57) ABSTRACT

In various embodiments, the beam parameter product and/or numerical aperture of a laser beam is adjusted utilizing a step-clad optical fiber having a central core, a first cladding, an annular core, and a second cladding.

26 Claims, 9 Drawing Sheets

Related U.S. Application Data

No. 15/479,745, filed on Apr. 5, 2017, now Pat. No. 10,088,632.

(60) Provisional application No. 62/318,959, filed on Apr. 6, 2016.

(51) Int. Cl.

| | | |
|---|---|---|
| *G02B 6/02* | (2006.01) | |
| *G02B 6/036* | (2006.01) | |
| *G02B 6/34* | (2006.01) | |
| *H01S 5/00* | (2006.01) | |
| *G02B 17/00* | (2006.01) | |
| *H01S 5/14* | (2006.01) | |
| *H01S 5/40* | (2006.01) | |
| *G02B 6/42* | (2006.01) | |
| *G02B 6/12* | (2006.01) | |

(52) U.S. Cl.
CPC .............. *G02B 17/00* (2013.01); *H01S 5/005* (2013.01); *G02B 6/4214* (2013.01); *G02B 2006/12104* (2013.01); *G02B 2006/12121* (2013.01); *H01S 5/0071* (2013.01); *H01S 5/143* (2013.01); *H01S 5/405* (2013.01); *H01S 5/4031* (2013.01); *H01S 5/4062* (2013.01); *H01S 5/4087* (2013.01); *H01S 2301/20* (2013.01)

(56) References Cited

U.S. PATENT DOCUMENTS

| | | | |
|---|---|---|---|
| 7,068,901 B2 * | 6/2006 | Hirano | C03B 37/01211 385/124 |
| 7,085,463 B2 | 8/2006 | Takahashi et al. | |
| 7,366,389 B2 * | 4/2008 | Iwasaki | G02B 6/02038 385/126 |
| 7,592,568 B2 | 9/2009 | Vamham et al. | |
| 7,603,015 B2 | 10/2009 | Bickham et al. | |
| 7,899,096 B1 * | 3/2011 | Bhatia | G02B 6/4225 359/326 |
| 7,936,797 B2 * | 5/2011 | Shibatani | G02B 7/021 372/107 |
| 8,773,755 B2 | 7/2014 | Nishihara et al. | |
| 8,781,269 B2 | 7/2014 | Huber et al. | |
| 9,166,365 B2 | 10/2015 | Park et al. | |
| 9,250,390 B2 | 2/2016 | Muendel et al. | |
| 9,482,821 B2 | 11/2016 | Huber et al. | |
| 10,088,632 B2 | 10/2018 | Zhou et al. | |
| 10,281,656 B2 | 5/2019 | Huber et al. | |
| 2003/0016441 A1 | 1/2003 | Leplingard et al. | |
| 2003/0021533 A1 * | 1/2003 | Ishikawa | G02B 6/021 385/37 |
| 2005/0175309 A1 | 8/2005 | Seo et al. | |
| 2007/0206912 A1 * | 9/2007 | Minelly | G02B 6/03605 385/124 |
| 2009/0317040 A1 * | 12/2009 | Yoshida | G02B 6/03605 385/126 |
| 2013/0034322 A1 * | 2/2013 | Auth | C03B 37/014 385/2 |
| 2013/0230290 A1 * | 9/2013 | Evans | G02B 6/03627 385/124 |
| 2013/0279867 A1 | 10/2013 | Oyamada et al. | |
| 2014/0376869 A1 * | 12/2014 | Lee | G02B 6/03611 385/127 |
| 2015/0247163 A1 | 8/2015 | Chann et al. | |
| 2015/0378184 A1 | 12/2015 | Tayebati et al. | |
| 2017/0293084 A1 | 10/2017 | Zhou et al. | |
| 2018/0372959 A1 | 12/2018 | Zhou et al. | |
| 2019/0258009 A1 | 8/2019 | Huber et al. | |

* cited by examiner

OPTICAL FIBER STRUCTURES AND METHODS FOR VARYING LASER BEAM PROFILE

RELATED APPLICATIONS

This application is a continuation of U.S. patent application Ser. No. 16/117,253, filed Aug. 30, 2018, which is a continuation of U.S. patent application Ser. No. 15/479,745, filed Apr. 5, 2017, which claims the benefit of and priority to U.S. Provisional Patent Application No. 62/318,959, filed Apr. 6, 2016, the entire disclosure of each of which is hereby incorporated herein by reference.

TECHNICAL FIELD

In various embodiments, the present invention relates to laser systems, specifically laser systems with controllable beam profiles, e.g., variable beam parameter products.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. The optical system is typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). That is, $BPP = NA \times D/2$, where D is the focusing spot (the waist) diameter and NA is the numerical aperture; thus, the BPP may be varied by varying NA and/or D. The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

In many laser-processing applications, the desired beam spot size, divergence, and beam quality may vary depending on, for example, the type of processing and/or the type of material being processed. This is particularly true for industrial lasers in material processing applications. For example, a lower BPP value, i.e., a better beam quality, may be preferred for cutting a thin metal, while a larger BPP (i.e., a worse beam quality) may be preferred for cutting through thicker metals. In order to make such changes to the BPP of the laser system, frequently the output optical system or the optical fiber must be swapped out with other components and/or realigned, a time-consuming and expensive process that may even lead to inadvertent damage of the fragile optical components of the laser system. Thus, there is a need for alternative techniques for varying the BPP of a laser system that do not involve such adjustments to the laser beam or optical system at the output of the optical fiber.

SUMMARY

Various embodiments of the present invention provide laser systems in which the BPP of the system (i.e., of its output laser beam) is varied via manipulation of the numerical aperture (NA) and the spot size (D) of the laser system while minimizing or substantially eliminating optical power losses. Embodiments of the invention involve coupling of the laser beam into a multi-clad optical fiber herein termed a "step-clad fiber." One exemplary step-clad fiber includes, consists essentially of, or consists of a center core, a first cladding disposed around the center core, the first annular core disposed around the first cladding, and a second cladding disposed around the first annular core. Step-clad fibers in accordance with embodiments of the invention are not limited to having only a single annular core and two claddings—one or more additional annular cores and associated claddings may be disposed around the second cladding. As utilized herein, the term "annular core" is defined as a ring-shaped region having a higher refractive index than both the inner and outer layers adjacent thereto. Layers other than the center core and the annular core(s) are typically claddings in a step-clad fiber. Such claddings have lower refractive indices than at least one layer adjacent thereto.

When conventional optical fibers are utilized in laser systems, laser power is typically intended to be only coupled into the cores. Any power "over-spray" on the claddings results in a loss of power and/or becomes a harmful factor to the optics downstream to the fiber. In contrast, laser systems utilizing step-clad fibers in accordance with embodiments of the present invention intentionally have partial or full laser power coupled into at least the first cladding, which is specifically designed with a higher refractive index and larger diameter than those of an internal cladding layer of a conventional multi-clad fiber. For example, the diameter of a first cladding in accordance with embodiments of the invention may range from about 140 μm to about 180 μm for a fiber having a central core diameter of 100 μm, compared to only 110 μm to 120 μm for conventional standard or multi-clad 100-μm-core optical fiber. In various embodiments, the thickness of the first cladding layer may range from, e.g., approximately 40 μm to approximately 100 μm, or approximately 40 to approximately 80 μm.

In embodiments of the invention, utilization of the step-clad fiber enables the variation of laser-system BPP based on not only the diameters of the cores and the power ratios in the cores, but also the thickness and refractive index of the first cladding and the power ratios in the first cladding (and/or in additional claddings, if present). The laser power coupled into the first cladding of the step-clad fiber is confined by the first annular core and enables a high degree of BPP variation. Moreover, coupling into the annular core(s) in accordance with embodiments of the invention enables the formation of output beams having uniform profiles without "gaps" or areas of low or no laser power therein; in contrast, conventional techniques in which coupling into cladding layers is impossible and/or actively avoided generally result in output beams having gaps (e.g., annular gaps) in the output beam profile. While embodiments of the invention may be utilized to produce output beam profiles that vary as a function of radius or diameter, even areas between high-intensity areas typically contain laser beam intensity (and are thus not "empty"), and/or any low-intensity or empty regions are very limited in spatial extent, particularly in comparison to output beams produced by conventional techniques.

Embodiments of the invention even include variations in which substantially no power is coupled into the one or more annular core regions of the step-clad fiber. Embodiments of the present invention typically vary BPP of the laser system via variation of both the output spot size D and NA and therefore provide a larger range of BPP variation than conventional techniques. For a given BPP variation range, embodiments of the present invention enable use of a step-clad fiber having a much smaller diameter of the first annular core than would be needed in conventional systems; thus, embodiments of the invention generate high-BPP laser beams of much smaller spot size with much less diluted power density. That is, a smaller change in the spot size D is needed in accordance with embodiments of the invention to vary the BPP (since the NA may also be simultaneously varied), thereby leading to less dilution of power density. For example, the diameter of a first annular core in accordance with embodiments of the invention may range from approximately 300 µm to approximately 400 µm (e.g., approximately 360 µm). The thickness of a first annular core in accordance with various embodiments may be, for example, approximately 60 µm to approximately 150 µm, approximately 80 µm to approximately 120 µm, approximately 90 µm to approximately 110 µm, or approximately 100 µm.

Herein, "optical elements" may refer to any of lenses, mirrors, prisms, gratings, and the like, which redirect, reflect, bend, or in any other manner optically manipulate electromagnetic radiation, unless otherwise indicated. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art.

Embodiments of the invention may be utilized with wavelength beam combining (WBC) systems that include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein. Multi-wavelength output beams of WBC systems may be utilized as input beams in conjunction with embodiments of the present invention for, e.g., BPP control.

In an aspect, embodiments of the invention feature a laser system that includes, consists essentially of, or consists of a beam source for emission of an input laser beam, a step-clad optical fiber having an input end and an output end opposite the input end, an in-coupling mechanism, and a controller. The step-clad optical fiber includes, consists essentially of, or consists of (i) a central core having a first refractive index, (ii) surrounding the central core, a first cladding having a second refractive index, (iii) surrounding the first cladding, an annular core having a third refractive index, and (iv) surrounding the annular core, a second cladding having a fourth refractive index. The first refractive index is larger than the fourth refractive index. The third refractive index is larger than the fourth refractive index. The second refractive index is smaller than the first refractive index and larger than the fourth refractive index. The in-coupling mechanism receives the input laser beam and directs the input laser beam toward the input end of the step-clad optical fiber, whereby the input laser beam is in-coupled into the step-clad optical fiber and emitted from the output end of the step-clad optical fiber as an output beam. The controller controls the in-coupling mechanism to direct the input laser beam onto one or more in-coupling locations on the input end of the step-clad optical fiber, whereby at least one of a beam parameter product or a numerical aperture of the output beam is determined at least in part by the one or more in-coupling locations.

Embodiments of the invention may include one or more of the following in any of a variety of combinations. At least one of the in-coupling locations may at least partially overlap the central core. At least one of the in-coupling locations may at least partially overlap the first cladding. At least one of the in-coupling locations may at least partially overlap the annular core. At least one of the in-coupling locations may at least partially overlap the second cladding. At least one of the in-coupling locations may at least partially overlap two or more of the central core, the first cladding, the annular core, or the second cladding. The in-coupling mechanism may include, consist essentially of, or consist of an optical element for focusing the input laser beam toward the input end of the step-clad optical fiber. The optical element may be movable (e.g., translatable, rotatable, and/or tiltable), in response to the controller, along (i) an axis substantially parallel to a propagation direction of the input laser beam and/or (ii) one or more axes substantially perpendicular to the propagation direction of the input laser beam. The in-coupling mechanism may include, consist essentially of, or consist of a reflector for receiving the input laser beam and reflecting the input laser beam toward the step-clad optical fiber. The optical element may include, consist essentially of, or consist of one or more lenses, one or more mirrors, and/or one or more prisms. The in-coupling mechanism may include, consist essentially of, or consist of a reflector for receiving the input laser beam and reflecting the input laser beam toward the step-clad optical fiber, the reflector being rotatable in response to the controller. The in-coupling mechanism may include an optical element for receiving the input laser beam from the reflector and focusing the input laser beam toward the step-clad optical fiber. The optical element may be movable (e.g., translatable, rotatable, and/or tiltable), in response to the controller, along (i) an axis substantially parallel to a propagation direction of the input laser beam and/or (ii) one or more axes substantially perpendicular to the propagation direction of the input laser beam. The optical element may include, consist essentially of, or consist of one or more lenses, one or more mirrors, and/or one or more prisms.

The beam source may be responsive to the controller. The controller may be configured to direct the input laser beam onto a plurality of different in-coupling locations without modulating an output power of (e.g., modulating the intensity of or switching off) the input laser beam as the input laser beam is directed between the different in-coupling locations. The controller may be configured to direct the input laser beam onto at least one in-coupling location at least partially overlapping the first cladding, whereby beam energy in-coupled into the first cladding forms at least a portion of the output beam. Beam energy in-coupled into the first cladding may be confined within the step-clad optical fiber at the interface between the annular core and the second cladding. The second refractive index may be smaller than the third refractive index. The second refractive index may be approximately equal to the third refractive index. The third refractive index may be smaller than the first refractive index. The third refractive index may be greater than the first refractive index. The beam source may include, consist essentially of, or consist of one or more beam emitters (each and/or collectively) emitting a plurality of discrete beams, focusing optics, a dispersive element, and a partially reflective output coupler. Each of the discrete beams may have a different wavelength. The focusing optics may focus the plurality of beams onto the dispersive element. The dispersive element may receive and disperse (i.e., wavelength disperses) the received focused beams. The partially reflective output coupler may be positioned to receive the dispersed beams, transmit a portion of the dispersed beams therethrough as the input laser beam, and reflect a second portion of the dispersed beams back toward the dispersive element. The input laser beam may be composed of multiple wavelengths. The dispersive element may include one or more diffraction gratings (e.g., a transmissive grating and/or a reflective grating).

In another aspect, embodiments of the invention feature a method of adjusting a beam parameter product and/or a numerical aperture of a laser beam. A step-clad optical fiber having an input end and an output end opposite the input end is provided. The step-clad optical fiber includes, consists essentially of, or consists of (i) a central core having a first refractive index, (ii) surrounding the central core, a first cladding having a second refractive index, (iii) surrounding the first cladding, an annular core having a third refractive index, and (iv) surrounding the annular core, a second cladding having a fourth refractive index. The first refractive index is larger than the fourth refractive index. The third refractive index is larger than the fourth refractive index. The second refractive index is smaller than the first refractive index and larger than the fourth refractive index. An input laser beam is directed onto one or more in-coupling locations on the input end of the step-clad optical fiber, whereby (i) the input laser beam is in-coupled into the step-clad optical fiber and emitted from the output end of the step-clad optical fiber as an output beam, and (ii) at least one of a beam parameter product of a numerical aperture of the output beam is determined at least in part by the one or more in-coupling locations.

Embodiments of the invention may include one or more of the following in any of a variety of combinations. At least one of the in-coupling locations may at least partially overlap the central core. At least one of the in-coupling locations may at least partially overlap the first cladding. At least one of the in-coupling locations may at least partially overlap the annular core. At least one of the in-coupling locations may at least partially overlap the second cladding. At least one of the in-coupling locations may at least partially overlap two or more of the central core, the first cladding, the annular core, or the second cladding. The input laser beam may be directed onto a plurality of different in-coupling locations to produce a single output beam or multiple output beams having different numerical apertures and/or beam parameter products. The output power of the input laser beam may not be modulated (e.g., decreased or switched off) as the input laser beam is directed between the different in-coupling locations. At least one of the in-coupling locations may at least partially overlap the first cladding, whereby beam energy in-coupled into the first cladding forms at least a portion of the output beam. Beam energy in-coupled into the first cladding may be confined within the step-clad optical fiber at the interface between the annular core and the second cladding. The second refractive index may be smaller than the third refractive index. The second refractive index may be approximately equal to the third refractive index. The third refractive index may be smaller than the first refractive index. The third refractive index may be greater than the first refractive index. The input laser beam may be emitted by a beam source. The beam source may include, consist essentially of, or consist of one or more beam emitters (each and/or collectively) emitting a plurality of discrete beams, focusing optics, a dispersive element, and a partially reflective output coupler. Each of the discrete beams may have a different wavelength. The focusing optics may focus the plurality of beams onto the dispersive element. The dispersive element may receive and disperse (i.e., wavelength disperses) the received focused beams. The partially reflective output coupler may be positioned to receive the dispersed beams, transmit a portion of the dispersed beams therethrough as the input laser beam, and reflect a second portion of the dispersed beams back toward the dispersive element. The input laser beam may be composed of multiple wavelengths. The dispersive element may include one or more diffraction gratings (e.g., a transmissive grating and/or a reflective grating).

In yet another aspect, embodiments of the invention feature a method of adjusting at least one of a beam parameter product or a numerical aperture of a laser beam. A step-clad optical fiber having an input end and an output end opposite the input end is provided. The step-clad optical fiber includes, consists essentially of, or consists of (i) a central core having a first refractive index, (ii) surrounding the central core, a first cladding having a second refractive index, (iii) surrounding the first cladding, an annular core having a third refractive index, and (iv) surrounding the annular core, a second cladding having a fourth refractive index. The third refractive index is larger than the fourth refractive index. The third refractive index is larger than the second refractive index. An input laser beam is directed onto one or more in-coupling locations on the input end of the step-clad optical fiber, whereby (i) the input laser beam is in-coupled into the step-clad optical fiber and emitted from the output end of the step-clad optical fiber as an output beam, and (ii) at least one of a beam parameter product or a numerical aperture of the output beam is determined at least in part by the one or more in-coupling locations. At least one of the in-coupling locations at least partially overlaps the first cladding, whereby beam energy in-coupled into the first cladding forms at least a portion of the output beam.

Embodiments of the invention may include one or more of the following in any of a variety of combinations. At least one of the in-coupling locations may at least partially overlap the central core. At least one of the in-coupling locations may at least partially overlap the annular core. At least one of the in-coupling locations may at least partially overlap the second cladding. At least one of the in-coupling locations may at least partially overlap two or more of the central core, the first cladding, the annular core, or the second cladding. The input laser beam may be directed onto a plurality of different in-coupling locations to produce a single output beam or multiple output beams having different numerical apertures and/or beam parameter products. The output power of the input laser beam may not be modulated (e.g., decreased or switched off) as the input laser beam is directed between the different in-coupling locations. The input laser beam may be emitted by a beam source. The beam source may include, consist essentially of, or consist of one or more beam emitters (each and/or collectively) emitting a plurality of discrete beams, focusing optics, a dispersive element, and a partially reflective output coupler. Each of the discrete beams may have a different wavelength. The focusing optics may focus the plurality of beams onto the dispersive element. The dispersive element may receive and disperse (i.e., wavelength disperses) the received focused beams. The partially reflective output coupler may be positioned to receive the dispersed beams, transmit a portion of the dispersed beams therethrough as the input laser beam, and reflect a second portion of the dispersed beams back toward the dispersive element. The input laser beam may be composed of multiple wavelengths. The dispersive element may include one or more diffraction gratings (e.g., a transmissive grating and/or a reflective grating).

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means ±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
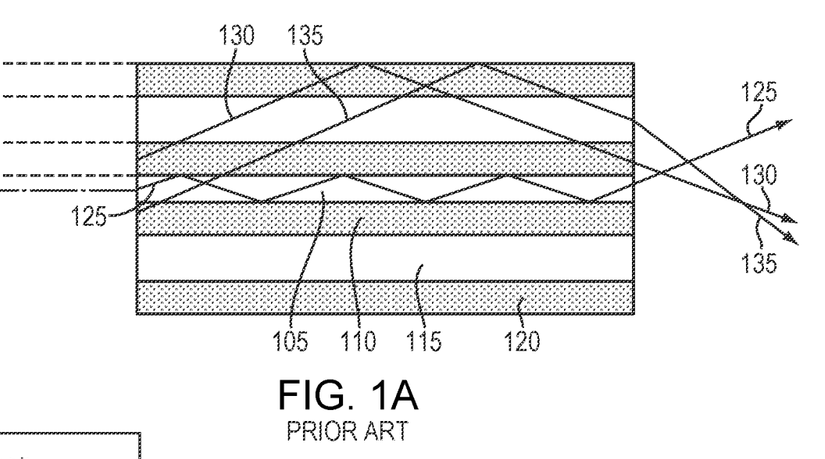
FIG. 1A is a schematic diagram of a conventional double-clad fiber and optical rays transmitted into the core and a cladding thereof.
Figure 1B:
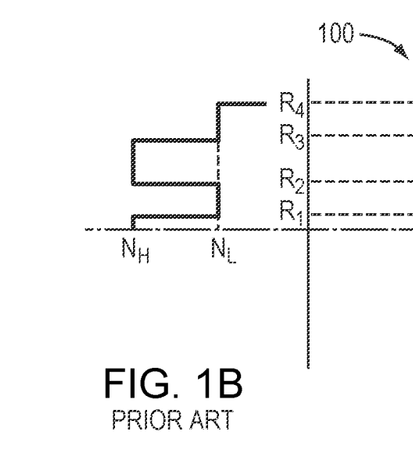
FIG. 1B is a schematic diagram of refractive indices of the various layers of the fiber of FIG. 1A.

FIG. 1A shows a conventional double-clad fiber 100 having a center core 105, an interior cladding 110, an annular core 115, and an exterior cladding 120. The radius of each layer (core or cladding) of the fiber 100 is represented by $R_1$, $R_2$, $R_3$, or $R_4$, as shown in FIG. 1B. In conventional double-clad fiber 100, the two cores 105, 115 typically have the same higher refractive index, $N_H$, and the two claddings 110, 120 typically have the same lower refractive index, $N_L$, as shown in FIG. 1B, and, therefore, the two cores 105, 115 have the same NA of sqrt($N_H^2 - N_L^2$).

FIG. 1A also depicts the transmission of three representative light rays in the fiber 100. Ray 125 is coupled into the center core 105, is confined by the center core 105, and exits from the center core 105 at the same angle as that which it entered the center core 105. Ray 130 and ray 135 are transmitted into the interior cladding 110, propagate within the entire fiber area, and are confined by the exterior cladding 120. Since the exit surface (the right edge of the fiber 100 in FIG. 1A) contains regions having two different refractive indices, ray 130 coupled into the interior cladding (which has a low refractive index) and exiting from the low refractive index region at the exit surface will typically have an exit angle equal to the input angle. Ray 135 coupled into the interior cladding and exiting from the higher refractive index region at the exit surface will typically have an exit angle larger than the input angle, as shown in FIG. 1A.

Figure 1C:
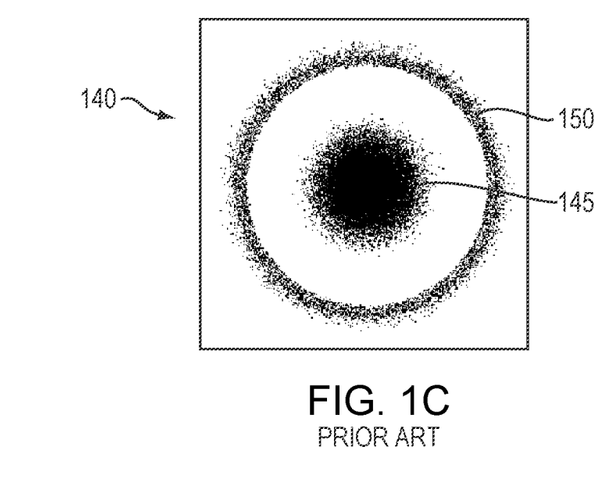
FIG. 1C is a plan view of a typical laser beam emanating from the fiber of FIG. 1A.

FIG. 1C is an image of an output profile 140 observed at a distance from the exit surface of conventional double-clad fiber 100 when a laser beam is transmitted into both the center core 105 and the interior cladding 110. As shown, output profile 140 contains two well-separated areas of beam intensity, a round central area 145 and an outer-ring area 150. Areas 145, 150 correspond to collections of two groups of rays belonging to two clusters of exiting angles from the fiber 100, as detailed above. The rays similar to ray 125 and ray 130 will exit at angles equal to their input angles and will contribute to the central round area 145, while the rays similar to ray 135 will exit at angles larger than their input angles and, therefore, form the outer-ring area 150. To a first approximation, if not considering any NA degradations due to fiber bending and non-uniformity, the NA of the central round area beam is typically the same as the laser input NA. However, the NA of the outer-ring beam 150, calculated by sqrt($NA_F^2+NA_{IN}^2$), is substantially larger than the input NA ($NA_N$) and also larger than the fiber NA ($NA_F$), where $NA_F$=sqrt($N_H^2-N_L^2$).

The interior cladding 100 of double-clad fiber 100 is relatively thin and is not intended for the in-coupling of laser energy. For 100 μm-core conventional double-clad fiber 100, the diameter of the first cladding will be normally be in the range of approximately 110-120 μm, i.e., a layer thickness of about 5-10 μm. However, the beam power entering the interior cladding of the fiber 100, as represented by the rays 130, 135 in FIG. 1A, will necessarily spread over to the outer cladding 120 and is typically either removed by mode strippers or transmitted through the fiber 100 with the majority forming the outer-ring area 150 shown in FIG. 1C. The former may post a great risk of burning the mode strippers and the fiber 100, and the latter nay damage the optics downstream of the fiber 100 due to the large NA of the outer-ring beam 150.

Figure 2A:
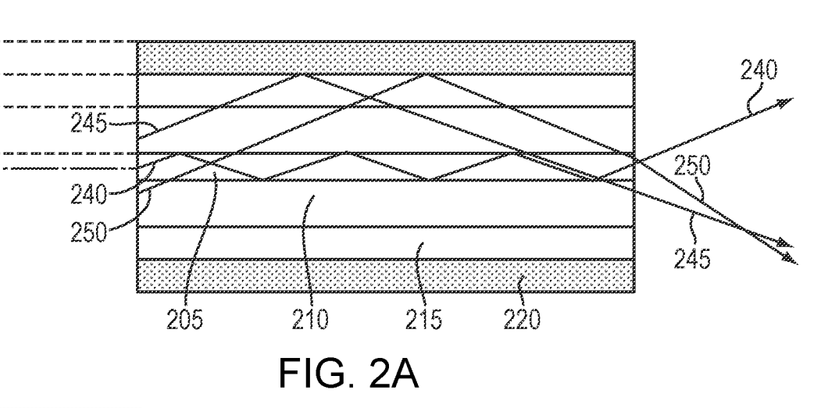
FIG. 2A is a schematic diagram of a step-clad fiber in accordance with various embodiments of the invention and optical rays transmitted into the center core and first cladding thereof.

Embodiments of the present invention include laser systems utilizing step-clad optical fibers, as illustrated in FIG. 2A. In accordance with various embodiments, a step-clad fiber 200 includes, consists essentially of, or consists of a center core 205, a first cladding 210, an annular core 215, and a second cladding 220. Advantageously, various properties of the first cladding 210 enable BPP variation based at least in part on the power coupled into the first cladding 210. FIG. 2C depicts an exemplary output profile 225 for laser beam energy coupled into the step-clad fiber 200. As shown, output profile 225 includes a central round area 230 and an outer-ring area 235 if observed at a distance from the fiber 200. However, the outer-ring area 235 shown in FIG. 2C typically has a much smaller NA than the corresponding area 150 depicted in FIG. 1C; thus, energy in area 235 may be safely accepted by the optics downstream to the fiber 200. For example, the outer-ring area 235 may have an NA of less than 0.18, less than 0.17, less than 0.16, or even less than 0.15 for an input laser NA of 0.1. In contrast, the corresponding area 150 may have an NA of at least 0.24 for an input laser NA of 0.1. In various embodiments, the NA of any outer-ring area 235 may be less than approximately 180% of the NA of the input laser, less than approximately 170% of the NA of the input laser, less than approximately 160% of the NA of the input laser, or even less than approximately 150% of the NA of the input laser. In various embodiments, the difference between the NA of any outer-ring area and the NA of the input laser may be less than approximately 0.08, less than approximately 0.07, less than approximately 0.06, or even less than approximately 0.05. In various embodiments, the difference between the NA of any outer-ring area and the NA of the input laser may be at least approximately 0.005, or even at least approximately 0.01. In various embodiments, the difference between the NA of any outer-ring area and the NA of the step-clad fiber may be less than 0.04, less than 0.03, less than 0.02, or less than 0.01. In various embodiments, the difference between the NA of any outer-ring area and the NA of the step-clad fiber may be at least 0.001, or even at least 0.005.

As depicted in FIG. 2A, a ray 240 transmitted into the center core 205 will typically be confined by the center core 205. Rays 245, 250 transmitted into the first cladding 210 will generally be confined by the first annular core 215. Ray 240, 245 will typically exit at angles equal to their corresponding input angles and will form the central round area 230 shown in FIG. 2C, while ray 250 will exit at a slightly larger angle than its corresponding input angle and will form the outer-ring area 235. In stark contrast with fiber 100 described above, rays emitted into the first cladding 210 generally will not reach the outer cladding 220 and, therefore, will not pose a risk of damaging (e.g., burning out) the fiber 200 or its associated optics. In various embodiments of the present invention, the step-clad fiber 200 is configured for the in-coupling of all or part of the input laser power into the first cladding 210. Such in-coupled power will be not be lost or pose a risk of damaging the fiber 200; rather, it may be a major contributor to BPP variation of the output beam.

Figure 2B:
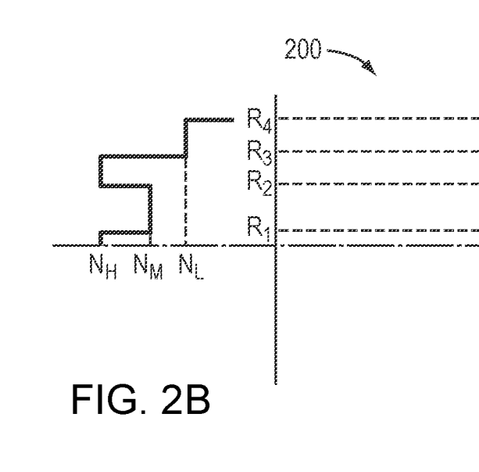
FIG. 2B is a schematic diagram of refractive indices of the various layers of the step-clad fiber of FIG. 2A in accordance with embodiments of the invention.
Figure 2C:
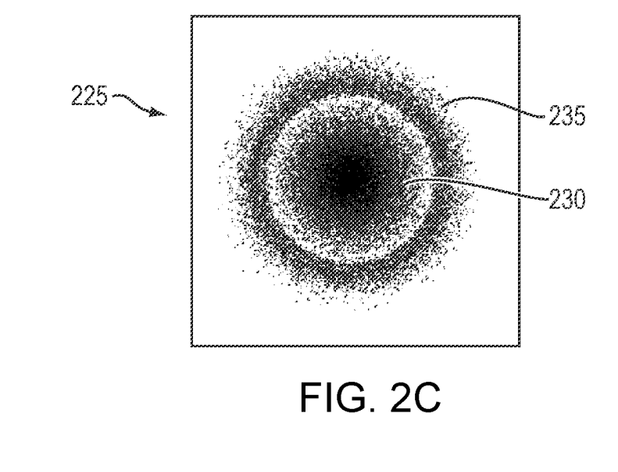
FIG. 2C is a plan view of a laser beam emanating from the step-clad fiber of FIG. 2A in accordance with embodiments of the invention.

FIG. 2B depicts the refractive index and radius of each layer of the step-clad fiber 200. In contrast with the refractive indices of fiber 100 shown in FIG. 1B, the refractive index ($N_M$) of the first cladding 210 of the fiber 200 has a value between a high index $N_H$ (not necessarily the high index of FIG. 1B) and a low index $N_L$ (not necessarily the low index of FIG. 1B), so that the center core 205 will have a smaller NA, given by sqrt($N_H^2-N_M^2$), than the NA of the annular core 215, given by sqrt($N_H^2-N_L^2$). While FIG. 2B depicts the indices of refraction of the center core 205 and the annular core 215 as being approximately equal to each other, in various embodiments the index of refraction of the annular core 215 may be different from (i.e., either less than or greater than) the index of refraction of the center core 205; however, in general, the index of refraction of the annular core 215 remains larger than the index of refraction of the first cladding 210.

For a given laser input NA ($NA_{IN}$), the difference between indices of refraction $N_H$ and $N_M$ will at least partially define the NA of the outer-ring beam 235 shown in FIG. 2C, and this NA is given by sqrt($N_H^2-N_M^2+NA_{IN}^2$). The smaller the index difference between $N_H$ and $N_M$, the smaller will be the outer-ring NA. However, reducing the index difference of $N_H$ and $N_M$ will typically also decrease the NA of the center core 205 and, therefore, may result in more rays escaping from the center core 205. Although such rays will be confined by the annular core 215, the rays escaping from the center core 205 may degrade the best possible BPP, i.e., may result in a higher initial BPP value for the output beam.

In various embodiments, the NA of center core 205 of the step-clad fiber 200 ranges from approximately 0.07 to approximately 0.17, or even from approximately 0.09 to approximately 0.14. In various embodiments, the effective NA of the first cladding 210 is larger than approximately 0.09, or even larger than approximately 0.12. In various embodiments, the refractive index of the first annular core 215 is equal or smaller than the refractive index of the center core 205.

Figure 3A:
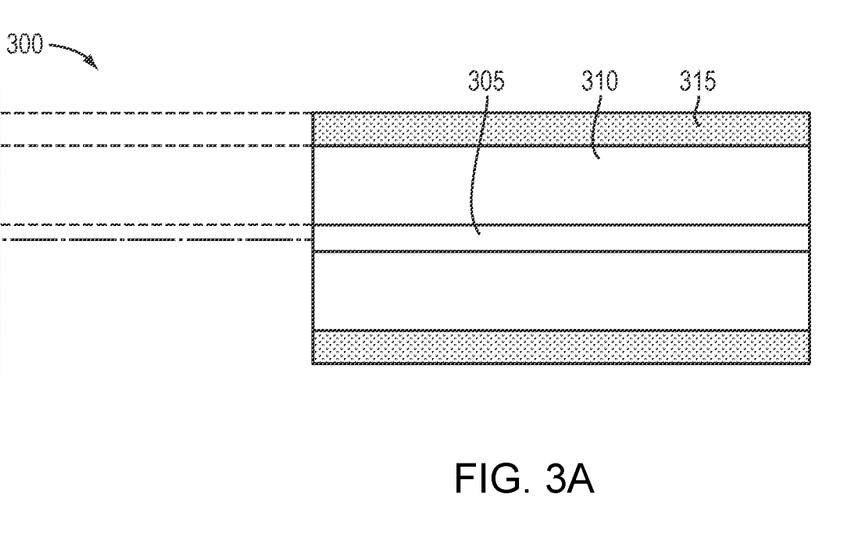
FIG. 3A is a schematic diagram of a step-clad fiber in accordance with various embodiments of the invention.
Figure 3B:
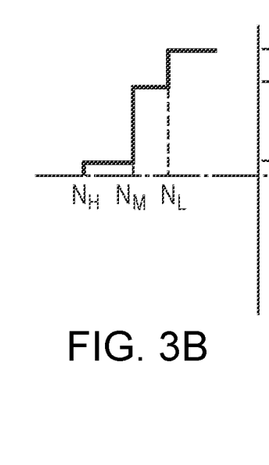
FIG. 3B is a schematic diagram of refractive indices of the various layers of the step-clad fiber of FIG. 3A in accordance with embodiments of the invention.

In various embodiments, the first annular core has the same refractive index as the first cladding, as shown in FIGS. 3A and 3B, in which the first annular core from FIG. 2A has merged into the first cladding. As shown, such a step-clad fiber 300 includes, consists essentially of, or consists of a center core 305, a first cladding 310, and a second cladding 315. As shown in FIG. 3B, the refractive index ($N_M$) of the first cladding 310 is between the refractive indices of the center core ($N_H$) and the second cladding ($N_L$). (All refractive index values are not necessarily the same as values depicted in FIGS. 1B and 2B.) In various embodiments, the NA of the center core 305 of step-clad fiber 300 ranges from approximately 0.07 to approximately 0.17, or even from approximately 0.09 to approximately 0.14. In various embodiments, the NA of the first cladding 310 of the step-clad fiber 300 is larger than approximately 0.09, or even larger than approximately 0.12.

As mentioned herein, step-clad fibers in accordance with embodiments of the invention may have substantially all or all of the laser power coupled into the first cladding. More power coupled into the first cladding will generally lead to larger BPP. In various embodiments, the diameter ratio of the first cladding and the center core is larger than 1.2, e.g., between 1.2 and 3, or even between 1.3 and 2.

The maximum BPP obtainable with a step-clad fiber in accordance with embodiments of the invention may be dependent on the diameter of the first annular core (or the diameter of the first cladding if the first annular core is absent). Therefore, in various embodiments, the diameter ratio of the first annular core (or the first cladding if the first annular core is absent) and the center core ranges from approximately 1.5 to approximately 6.5, or even from approximately 2 to approximately 5.

Structurally, optical fibers in accordance with embodiments of the invention may include one or more layers of high and/or low refractive index beyond (i.e., outside of) the second cladding without altering the principles of the present invention. Such additional layers may also be termed claddings and annular cores, but may not guide light. Such variants are within the scope of the present invention. In accordance with various embodiments of the invention, the various core and cladding layers of step-clad fibers may include, consist essentially of, or consist of glass, such as substantially pure fused silica and/or fused silica doped with fluorine, titanium, germanium, and/or boron.

Figure 4A:
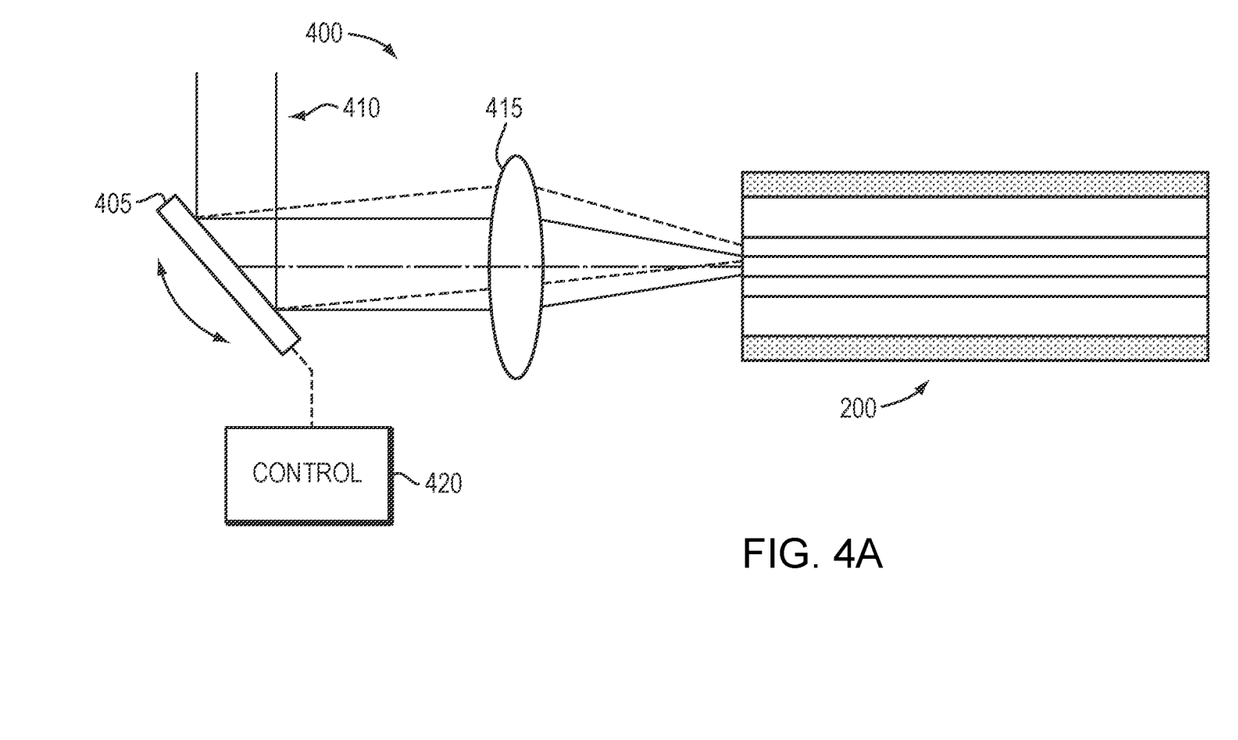
FIG. 4A is a schematic diagram of portions of a laser system utilizing a step-clad fiber in accordance with embodiments of the invention.

An exemplary laser system 400 for varying BPP using a step-clad fiber 200 in accordance with embodiments of the invention is depicted in FIG. 4. (Such systems may alternatively utilize step-clad fiber 300 in accordance with embodiments of the invention.) As shown, the laser system 400 includes an adjustable reflector 405 (e.g., a tip-tilt adjustable mirror) to redirect an incoming input laser beam 410 to a fiber coupling optical element 415 (e.g., one or more lenses), which focuses the beam 410 toward the step-clad fiber 200. As shown, the region of the input face of step-clad fiber 200 at which the beam 410 is in-coupled is at least partially defined by the configuration (e.g., the position and/or angle) of the reflector 405. For the best starting beam quality (i.e., the smallest BPP), the step-clad fiber 200 is typically located at the focal spot of the optical element 415.

The configuration of the reflector 405 may be controlled via a controller 420 and/or one or more actuators (not shown) operatively connected to the reflector 405. Thus, the reflector 405 and/or the one or more actuators may be responsive to controller 420. The controller 420 may be responsive to a desired target radiation power distribution and/or BPP or other measure of beam quality (e.g., input by a user and/or based on one or more properties of a workpiece to be processed such as the distance to the workpiece, the composition of the workpiece, topography of the workpiece, etc.) and configured to angle reflector 405 to cause the beam 410 to strike the input face of the step-clad fiber 200 such that the output beam output from the step-clad fiber 200 has the target radiation power distribution or beam quality. The output beam thus produced may be directed to a workpiece for processes such as annealing, cutting, welding, drilling, etc. The controller 420 may be programmed to achieve the desired power distribution and/or output BPP and/or beam quality via a particular reflector tilt as detailed herein.

The controller 420 may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680×0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described herein. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as FORTRAN, PASCAL, JAVA, C, C++, C#, BASIC, various scripting languages, and/or HTML. Additionally, the software may be implemented in an assembly language directed to the microprocessor resident on a target computer; for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

Figure 4B:
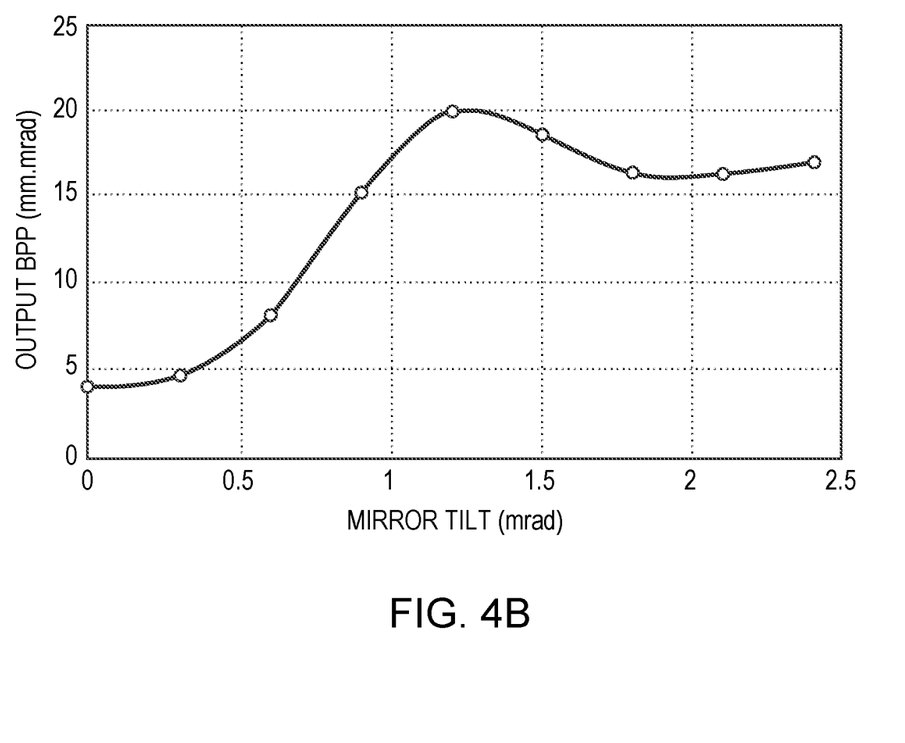
FIG. 4B is a graph of variation in output BPP as a function of reflector tilt for the laser system of FIG. 4A in accordance with embodiments of the invention.
Figure 4C:
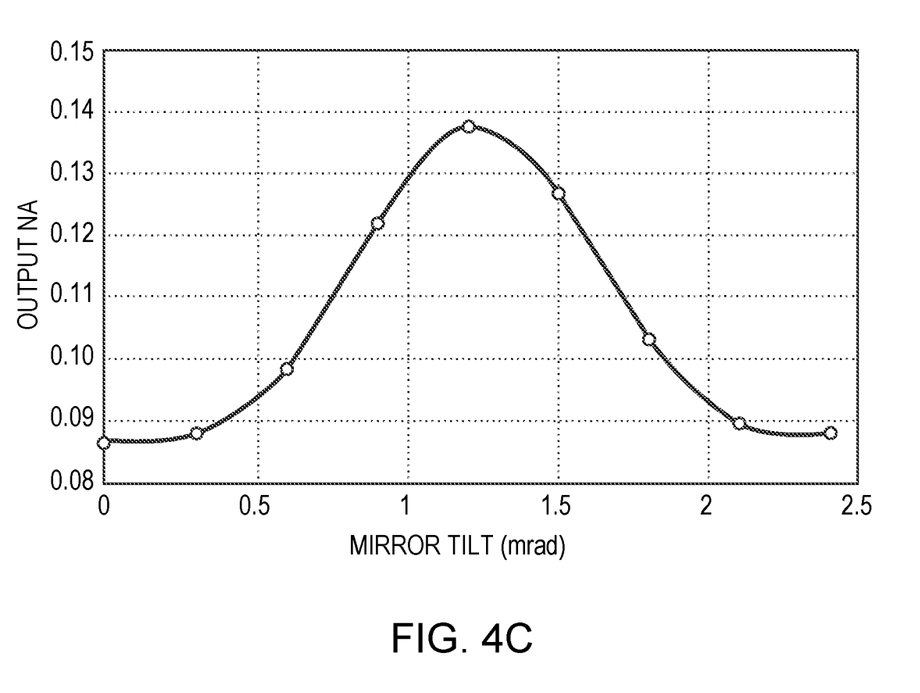
FIG. 4C is a graph of variation of output NA as a function of reflector tilt for the laser system of FIG. 4A in accordance with embodiments of the invention.

Simulation results of the output BPP and NA of the laser system 400 are depicted in FIGS. 4B and 4C, respectively. In FIGS. 4B and 4C, the optical element 415 has a 30 mm focal length, and the step-clad fiber 200 has diameters of 100 µm, 160 µm, 360 µm, and 400 µm for the center core, the first cladding, the first annular core, and the second cladding, respectively. The NAs of the center core and the first annular core are 0.12 and 0.22, respectively. As shown in FIG. 4B, the BPP ranges from approximately 4 mm-mrad and reaches a maximum at approximately 20 mm-mrad at reflector tilt of about 1.2 mrad. The BPP variation is a combined result of output spot size (D) change and NA change. As the reflector tilt gradually increases from its initial zero position, more power is coupled into the first cladding, which effectively enlarges the output spot size (D) and the NA and thus the BPP. Further increases of reflector tilt (above approximately 1.2 mrad) result, in this example, in smaller NA due to decreased power coupled into the first cladding. FIG. 4C indicates that the output NA decreases back to its initial smallest NA (obtained at 0 reflector tilt) when the reflector tilt is larger than approximately 2.2 mrad, at which point all the power is coupled into the first annular core. As evident from FIGS. 4B and 4C, the power coupled into the first cladding is not lost, but instead plays a major role in BPP variation.

In addition, the maximum BPP of approximately 20 mm-mrad for this exemplary embodiment is obtained with a step-clad fiber in which the diameter of the first annular core is 360 µm. For the same BPP range, conventional techniques would require a double-clad fiber having a first annular core diameter of 500 µm, which would result in an almost two-times lower power density at the laser focal spot than in the exemplary embodiment of the present invention. Thus, as indicated, embodiments of the invention advantageously generate larger BPP with increased NA, which is generally desired for large-BPP applications (to, e.g., generate and maintain higher power density of the output beam).

Figure 5:
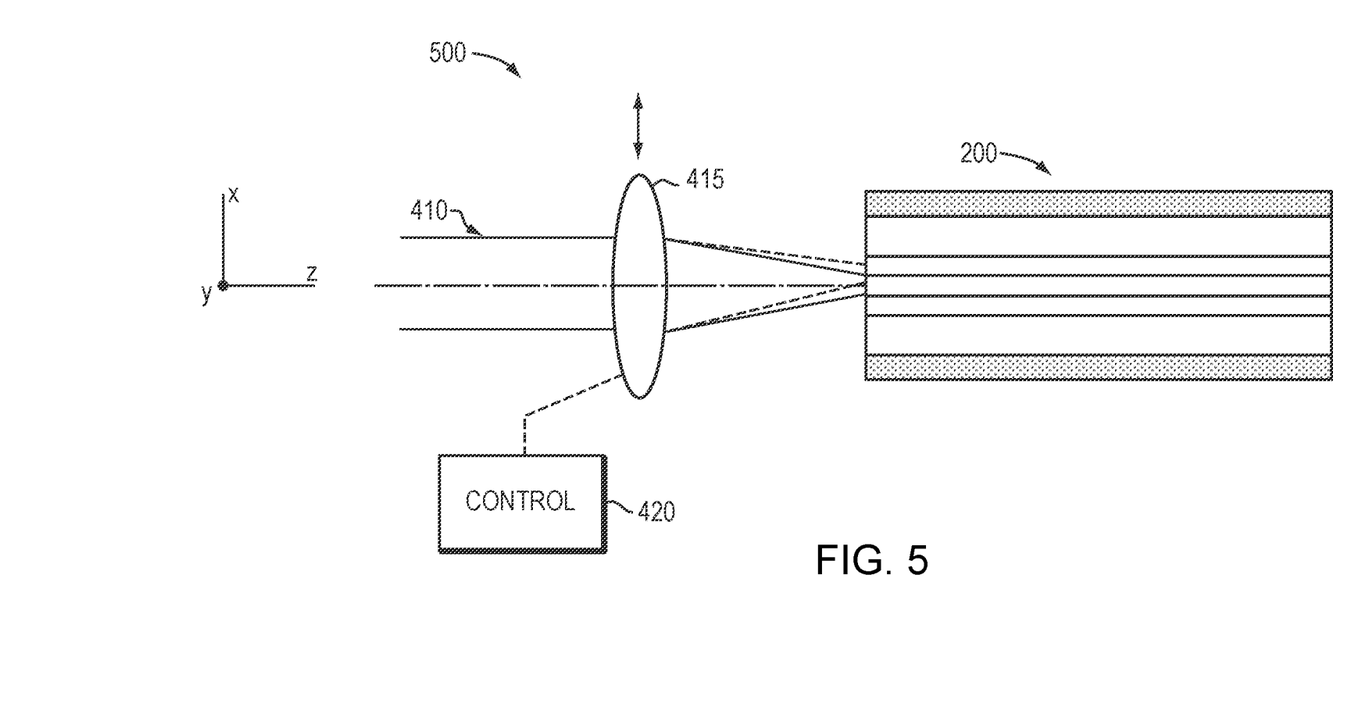
FIGS. 5 and 6 are schematic diagrams of portions of laser systems utilizing a step-clad fiber and adjustable lenses in accordance with embodiments of the invention.
Figure 6:
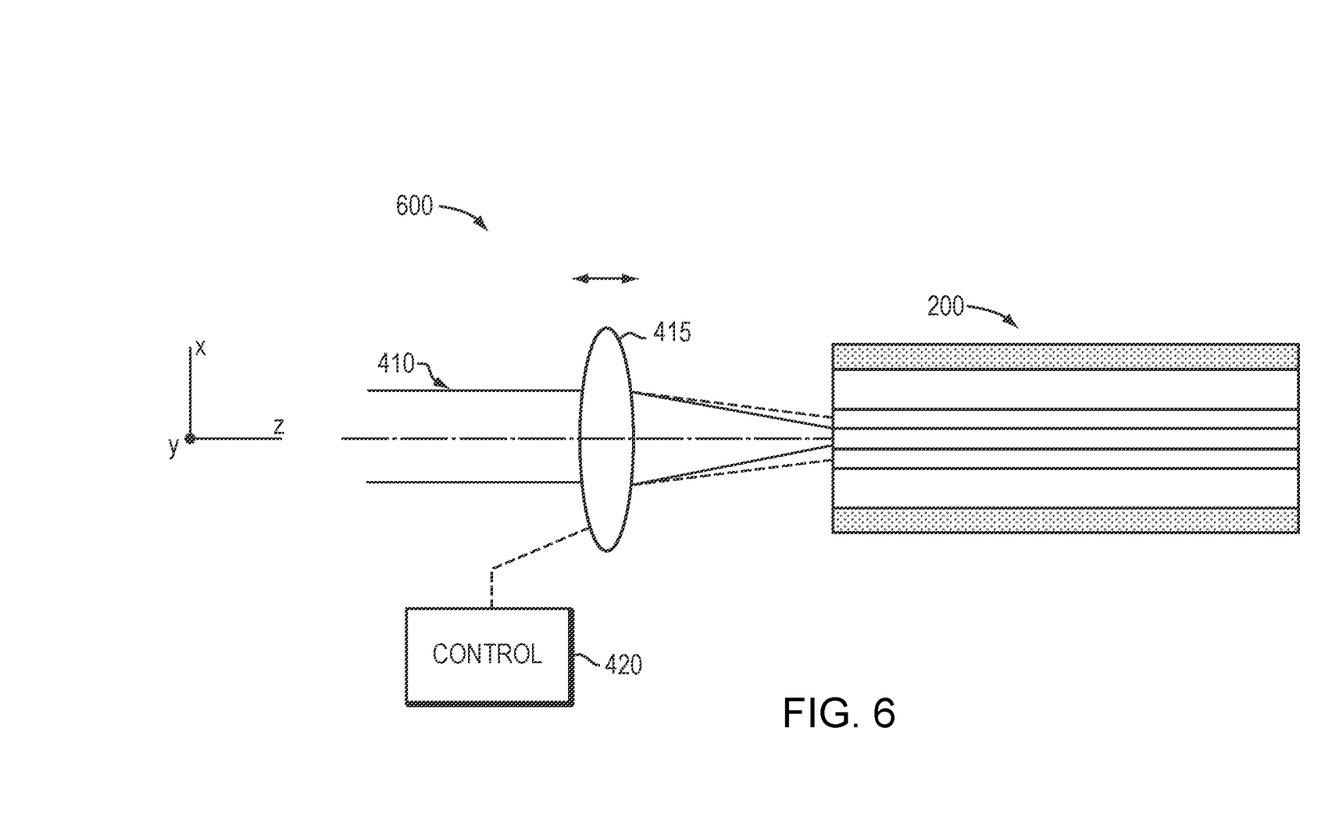

FIG. 5 depicts a laser system 500 in accordance with embodiments of the invention with a step-clad fiber (51). In laser system 500, the controller 420 directly controls the optical element 415, which is adjustable (i.e., translatable) in the directions (i.e., x and y as shown in FIG. 5) orthogonal to the input propagation direction of input beam 410 (i.e., z as shown in FIG. 5). For example, the controller 420 may control a lens manipulation system (e.g., one or more motorized stages or actuators movable in two or three dimensions) to control the movements of optical element 415 and thereby adjust the in-coupling position of the input beam 410 on the input surface of step-clad fiber 200 (and, thus, the BPP of the output beam emerging from the step-clad fiber 200). As with laser system 400, the relative amounts of the input beam 400 coupled into the various regions of step-clad fiber 200 results in a controllable variable BPP and/or NA of the output beam. FIG. 6 depicts a similar laser system 600, in which the optical element 415 is adjustable in the direction parallel to the input propagation direction of input beam 410 (i.e., z as shown in FIG. 6) via, e.g., one or more motorized stages or actuators. Translation of the optical element 415 with respect to the step-clad fiber 200 alters the amount of the beam that propagates to, and is in-coupled into, the various regions of step-clad fiber 200. As with laser system 400, laser systems 500, 600 may be utilized with step-clad fiber 300 in addition to or instead of step-clad fiber 200. Laser systems in accordance with embodiments of the invention may also combine translation of optical element 415 (as in FIGS. 5 and 6) with adjustment of reflector 405 (as in FIG. 4) to controllably adjust the BPP and/or NA of the beam output from the step-clad fiber.

Laser systems 400, 500, 600 may be utilized to alter the BPP and/or NA of a laser beam in a continuous fashion without the need to power down (i.e., switch off) the input laser beam as the beam is swept across the input face of the step-clad fiber such that different portions of the beam are in-coupled into different regions of the fiber. Because the step-clad fibers 200, 300 are configured such that beam energy propagating to a cladding region (e.g., the first cladding) is confined and will not lead to damage to the fiber or optics (e.g., optical elements) associated therewith, the input beam need not be switched off as it or a portion thereof strikes the cladding(s) of the step-clad fiber.

Embodiments of the present invention may also utilize systems and techniques of BPP variation as described in U.S. patent application Ser. No. 14/632,283, filed on Feb. 26, 2015, U.S. patent application Ser. No. 14/747,073, filed on Jun. 23, 2015, U.S. patent application Ser. No. 14/852,939, filed on Sep. 14, 2015, and U.S. patent application Ser. No. 15/188,076, filed on Jun. 21, 2016, the entire disclosure of each of which is incorporated by reference herein.

Figure 7:
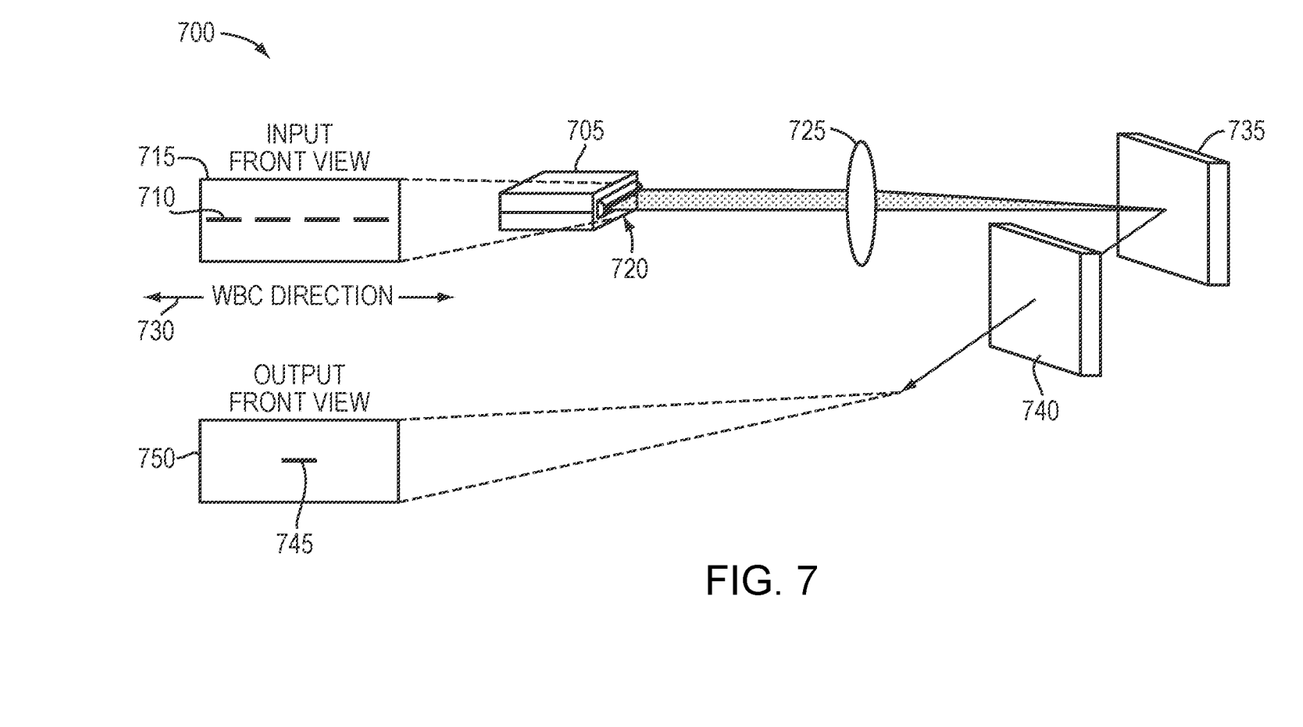
FIG. 7 is a schematic diagram of a wavelength beam combining laser system that may be utilized to supply the input beam for laser systems in accordance with various embodiments of the invention.

Laser systems and laser delivery systems in accordance with embodiments of the present invention and detailed herein may be utilized in and/or with WBC laser systems. Specifically, in various embodiments of the invention, multi-wavelength output beams of WBC laser systems may be utilized as the input beams for laser beam delivery systems for variation of BPP as detailed herein. FIG. 7 depicts an exemplary WBC laser system 700 that utilizes one or more lasers 705. In the example of FIG. 7, laser 705 includes a diode bar having four beam emitters emitting beams 710 (see magnified input view 715), but embodiments of the invention may utilize diode bars emitting any number of individual beams or two-dimensional arrays or stacks of diodes or diode bars. In view 715, each beam 710 is indicated by a line, where the length or longer dimension of the line represents the slow diverging dimension of the beam, and the height or shorter dimension represents the fast diverging dimension. A collimation optic 720 may be used to collimate each beam 710 along the fast dimension. Transform optic(s) 725, which may include or consist essentially of one or more cylindrical or spherical lenses and/or mirrors, are used to combine each beam 710 along a WBC direction 730. The transform optics 725 then overlap the combined beam onto a dispersive element 735 (which may include, consist essentially of, or consist of, e.g., a reflective or transmissive diffraction grating, a dispersive prism, a grism (prism/grating), a transmission grating, or an Echelle grating), and the combined beam is then transmitted as single output profile onto an output coupler 740. The output coupler 740 then transmits the combined beams 745 as shown on the output front view 750. The output coupler 740 is typically partially reflective and acts as a common front facet for all the laser elements in this external cavity system 700. An external cavity is a lasing system where the secondary mirror is displaced at a distance away from the emission aperture or facet of each laser emitter. In some embodiments, additional optics are placed between the emission aperture or facet and the output coupler or partially reflective surface. The output beam 745 is a thus a multiple-wavelength beam (combining the wavelengths of the individual beams 710), and may be utilized as the input beam in laser systems detailed herein and/or may be coupled into a step-clad optical fiber as detailed herein.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:
1. A step-clad optical fiber for use in a laser system comprising (i) a beam source for emission of an input laser beam and (ii) a controller for adjusting a position, at an input end of the step-clad optical fiber, of the input laser beam relative to a longitudinal axis of the step-clad optical fiber, whereby a resulting output beam is emitted from an output end of the step-clad optical fiber opposite the input end, the step-clad optical fiber comprising:
  a central core having a first refractive index;
  surrounding the central core, a first cladding having a second refractive index smaller than the first refractive index;
  surrounding the first cladding, a first annular core having a third refractive index larger than the second refractive index;
  surrounding the first annular core, a second cladding having a fourth refractive index smaller than the third refractive index;
  surrounding the second cladding, a second annular core having a fifth refractive index larger than the fourth refractive index; and
  surrounding the second annular core, a third cladding having a sixth refractive index smaller than the fifth refractive index,
  wherein (i) the third refractive index is larger than the first refractive index, and/or (ii) the fifth refractive index is larger than the first refractive index, and wherein the second annular core is configured for the in-coupling and transmission of at least a portion of the input laser beam, whereby light from the input laser beam coupled into the second annular core is emitted as at least a portion of the output beam.

2. The step-clad optical fiber of claim 1, wherein the third refractive index is substantially equal to the first refractive index.

3. The step-clad optical fiber of claim 1, wherein the second refractive index is larger than the fourth refractive index.

4. The step-clad optical fiber of claim 1, wherein the second refractive index is larger than the sixth refractive index.

5. The step-clad optical fiber of claim 1, wherein a numerical aperture of the first cladding is larger than 0.12.

6. The step-clad optical fiber of claim 1, wherein a thickness of the first cladding ranges from approximately 40 μm to approximately 100 μm.

7. The step-clad optical fiber of claim 1, wherein a thickness of the first annular core ranges from approximately 60 μm to approximately 150 μm.

8. The step-clad optical fiber of claim 1, wherein a ratio of a diameter of the first cladding to a diameter of the central core ranges between 1.2 and 3.

9. The step-clad optical fiber of claim 1, wherein a ratio of a diameter of the first annular core to a diameter of the central core ranges between 1.5 and 6.5.

10. The step-clad optical fiber of claim 1, further comprising:
    surrounding the third cladding, a third annular core having a seventh refractive index larger than the sixth refractive index; and
    surrounding the third annular core, a fourth cladding having an eighth refractive index smaller than the seventh refractive index,
    wherein the third annular core is configured for the in-coupling and transmission of at least a portion of the input laser beam, whereby light from the input laser beam coupled into the third annular core is emitted as at least a portion of the output beam.

11. A laser system comprising:
    a beam source for emission of an input laser beam;
    a step-clad optical fiber having an input end and an output end opposite the input end, the step-clad optical fiber comprising (i) a central core having a first refractive index, (ii) surrounding the central core, a first cladding having a second refractive index smaller than the first refractive index, (iii) surrounding the first cladding, a first annular core having a third refractive index larger than the second refractive index, (iv) surrounding the first annular core, a second cladding having a fourth refractive index smaller than the third refractive index, (v) surrounding the second cladding, a second annular core having a fifth refractive index larger than the fourth refractive index, and (vi) surrounding the second annular core, a third cladding having a sixth refractive index smaller than the fifth refractive index; and
    a controller for (i) receiving a desired beam-quality parameter based on one or more properties of a workpiece to be processed, (ii) adjusting a position, at the input end of the step-clad optical fiber, of the input laser beam relative to a longitudinal axis of the step-clad optical fiber, whereby a resulting output beam having the desired beam-quality parameter is emitted from the output end of the step-clad optical fiber, and (iii) processing the workpiece with the output beam.

12. The laser system of claim 11, further comprising, responsive to the controller, an in-coupling mechanism for receiving the input laser beam and directing the input laser beam toward the input end of the step-clad optical fiber.

13. The laser system of claim 12, wherein the in-coupling mechanism comprises an optical element that is adjustable, in response to the controller, along at least one of (i) an axis substantially parallel to a propagation direction of the input laser beam or (ii) one or more axes substantially perpendicular to the propagation direction of the input laser beam.

14. The laser system of claim 13, wherein the optical element comprises one or more lenses, one or more mirrors, one or more prisms, and/or one or more gratings.

15. The laser system of claim 11, wherein the controller is configured to adjust the position of the input laser beam relative to the longitudinal axis of the step-clad optical fiber without modulating an output power of the input laser beam.

16. A laser system comprising:
    a beam source for emission of an input laser beam;
    a step-clad optical fiber having an input end and an output end opposite the input end, the step-clad optical fiber comprising (i) a central core having a first refractive index, (ii) surrounding the central core, a first cladding having a second refractive index smaller than the first refractive index, (iii) surrounding the first cladding, a first annular core having a third refractive index larger than the second refractive index, (iv) surrounding the first annular core, a second cladding having a fourth refractive index smaller than the third refractive index, (v) surrounding the second cladding, a second annular core having a fifth refractive index larger than the fourth refractive index, and (vi) surrounding the second annular core, a third cladding having a sixth refractive index smaller than the fifth refractive index; and
    a controller for adjusting a position, at the input end of the step-clad optical fiber, of the input laser beam relative to a longitudinal axis of the step-clad optical fiber, whereby a resulting output beam is emitted from the output end of the step-clad optical fiber,
    wherein the beam source comprises:
        one or more beam emitters emitting a plurality of discrete beams;
        focusing optics for focusing the plurality of beams onto a dispersive element;
        the dispersive element for receiving and dispersing the received focused beams; and
        a partially reflective output coupler positioned to receive the dispersed beams, transmit a portion of the dispersed beams therethrough as the input laser beam, and reflect a second portion of the dispersed beams back to the dispersive element and thence to the one or more beam emitters to form an external lasing cavity,
        wherein the input laser beam is composed of multiple wavelengths.

17. The laser system of claim 16, wherein the dispersive element comprises a diffraction grating.

18. The laser system of claim 11, wherein the step-clad optical fiber comprises:
    surrounding the third cladding, a third annular core having a seventh refractive index larger than the sixth refractive index; and
    surrounding the third annular core, a fourth cladding having an eighth refractive index smaller than the seventh refractive index.

19. A method of processing a workpiece with a laser beam, the method comprising:

providing a step-clad optical fiber having an input end and an output end opposite the input end, the step-clad optical fiber comprising (i) a central core having a first refractive index, (ii) surrounding the central core, a first cladding having a second refractive index smaller than the first refractive index, (iii) surrounding the first cladding, a first annular core having a third refractive index larger than the second refractive index, (iv) surrounding the first annular core, a second cladding having a fourth refractive index smaller than the third refractive index, (v) surrounding the second cladding, a second annular core having a fifth refractive index larger than the fourth refractive index, and (vi) surrounding the second annular core, a third cladding having a sixth refractive index smaller than the fifth refractive index;

selecting one or more in-coupling locations on the input end of the step-clad optical fiber based on at least one of a desired beam parameter product or a desired numerical aperture of an output beam;

directing an input laser beam onto the one or more in-coupling locations on the input end of the step-clad optical fiber, whereby (i) the input laser beam is in-coupled into the step-clad optical fiber and emitted from the output end of the step-clad optical fiber as the output beam, and (ii) at least one of the beam parameter product or the numerical aperture of the output beam is determined at least in part by the one or more in-coupling locations; and processing a workpiece with the output beam having the at least one of the desired beam parameter product or the desired numerical aperture.

20. A method of processing a workpiece with a laser beam, the method comprising:

providing a step-clad optical fiber having an input end and an output end opposite the input end, the step-clad optical fiber comprising (i) a central core having a first refractive index, (ii) surrounding the central core, a first cladding having a second refractive index smaller than the first refractive index, (iii) surrounding the first cladding, a first annular core having a third refractive index larger than the second refractive index, (iv) surrounding the first annular core, a second cladding having a fourth refractive index smaller than the third refractive index, (v) surrounding the second cladding, a second annular core having a fifth refractive index larger than the fourth refractive index, and (vi) surrounding the second annular core, a third cladding having a sixth refractive index smaller than the fifth refractive index;

directing an input laser beam onto one or more first in-coupling locations on the input end of the step-clad optical fiber, at least one first in-coupling locations being disposed on the central core;

directing the input laser beam onto one or more second in-coupling locations on the input end of the step-clad optical fiber different from the one or more first in-coupling locations, at least one second in-coupling location being disposed outside of the central core, whereby at least one of a beam parameter product or a numerical aperture of the output beam is altered when the input laser beam is directed from the one or more first in-coupling locations to the one or more second in-coupling locations; and processing a workpiece with the output beam having the altered beam parameter product and/or the altered numerical aperture.

21. The laser system of claim 11, wherein the one or more properties of the workpiece comprise at least one of a composition of the workpiece, a thickness of the workpiece, a topography of the workpiece, or a distance to the workpiece.

22. The laser system of claim 11, wherein processing the workpiece comprises at least one of annealing, cutting, welding, or drilling.

23. The method of claim 19, wherein processing the workpiece comprises at least one of annealing, cutting, welding, or drilling.

24. The method of claim 20, wherein processing the workpiece comprises at least one of annealing, cutting, welding, or drilling.

25. The step-clad optical fiber of claim 1, wherein the first annular core is configured for the in-coupling and transmission of at least a portion of the input laser beam, whereby light from the input laser beam coupled into the first annular core is emitted as at least a portion of the output beam.

26. The step-clad optical fiber of claim 1, wherein the first cladding is configured for the in-coupling and transmission of at least a portion of the input laser beam, whereby light from the input laser beam coupled into the first cladding is emitted as at least a portion of the output beam.

* * * * *